United States Patent
Kuhara et al.

(10) Patent No.: US 6,847,053 B2
(45) Date of Patent: Jan. 25, 2005

(54) OPTICAL TRANSMITTER

(75) Inventors: Yoshiki Kuhara, Osaka (JP); Naoyuki Yamabayashi, Osaka (JP); Manabu Shiozaki, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 110 days.

(21) Appl. No.: 10/169,154

(22) PCT Filed: Nov. 29, 2001

(86) PCT No.: PCT/JP01/10459
§ 371 (c)(1),
(2), (4) Date: Jun. 28, 2002

(87) PCT Pub. No.: WO02/063730
PCT Pub. Date: Aug. 15, 2002

(65) Prior Publication Data
US 2003/0102496 A1 Jun. 5, 2003

(30) Foreign Application Priority Data
Feb. 5, 2001 (JP) .................................... 2001-027597

(51) Int. Cl.$^7$ .............................................. H01L 29/26
(52) U.S. Cl. ............................ 257/82; 257/80; 385/49; 385/88
(58) Field of Search ................................ 257/228, 226, 257/80, 81, 82; 385/49, 88, 92, 94; 250/552

(56) References Cited

U.S. PATENT DOCUMENTS 5,032,879 A * 7/1991 Buchmann et al. ......... 257/432
5,557,116 A * 9/1996 Masui et al. ................. 257/100
5,966,488 A * 10/1999 Miura et al. .................. 385/93
5,978,535 A * 11/1999 Mitsuda et al. ............... 385/88
6,435,734 B2 * 8/2002 Okada et al. ................. 385/88
6,476,379 B2 * 11/2002 Ando et al. ............ 250/227.11
6,567,590 B1 * 5/2003 Okada et al. ................. 385/49

FOREIGN PATENT DOCUMENTS

| DE | 43 13 492 | | 7/1994 |
|---|---|---|---|
| JP | 61-158970 | * | 2/1986 |
| JP | 8-37339 | | 2/1996 |
| JP | 9-26529 | | 1/1997 |
| JP | 10-22576 | | 1/1998 |
| JP | 10-341062 | | 12/1998 |
| JP | 11-274654 | | 10/1999 |

* cited by examiner

*Primary Examiner*—Sara Crane
(74) *Attorney, Agent, or Firm*—Smith, Gambrell & Russell, LLP

(57) ABSTRACT

In an optical transmitter in which the amount of light of an LD is monitored by a monitor PD, and the power of the LD is kept constant by feedback, the present invention aims to provide an optical transmitter that is suitable for size and cost reductions while being able to input a greater amount of the LD light of to the monitor PD, and that is capable of performing higher-bit-rate transmission. The present invention is characterized in that a concave groove is formed in a substrate, and the monitor photodiode is mounted on a slanted face of the concave groove, and the light of the LD that is oppositely and horizontally disposed is received directly by the monitor the LD photodiode.

7 Claims, 8 Drawing Sheets

EMBODIMENT 1

EMBODIMENT 1

EMBODIMENT 1

EMBODIMENT 2

OPTICAL TRANSMITTER

TECHNICAL FIELD

This invention relates to an optical transmitter for optical communications containing a semiconductor laser diode (semiconductor LD) and a monitor photodiode (monitor PD). More particularly, it relates to a small-sized, low-cost optical transmitter realized by devising an arrangement of a monitor PD.

BACKGROUND ART

Presently, the most widely used optical transmitter has a three-dimensional structure that houses LD for emitting transmission light to a cylindrical metal package, a monitor PD for monitoring LD output, a lens for condensing and causing the transmission light to be incident on optical fibers, and a cap for holding the lens.

FIGS. 1, 2, and 3 each show conventional optical transmitters. A vertical pole 2 is formed on a disk-like metallic stem 1. A semiconductor LD 4 on a submount 3 that generates a signal light beam is fixed sideways onto a side face of the pole 2. A monitor PD 5 is disposed just under the semiconductor LD. This is insulated with a submount 6 from the stem 1. Lead pins 7 through 9 are projecting from the bottom of the stem downward. The electrodes of the monitor PD 5 and the LD 4 are connected to the lead pins by wires 10 and 11. A lens 12 is disposed just above the semiconductor LD 4. This is a ball lens and is held by a cylindrical cap 13. An optical fiber 14 is disposed thereabove.

In practice, a cylindrical, thin ferrule holds the optical fiber 14, and a cylindrical metallic ferrule holder holds this ferrule. The metallic ferrule holder is soldered onto the upper surface of the stem 1. The metallic stem and the metallic ferrule holder constitute a metal package. The metal package is hermetically sealed and is filled with an inert gas.

Such an outer shell of the metal package is not illustrated in the drawings. The semiconductor LD 4 emits light from both end faces thereof. A front light 15 is signal light beam, and a rear light 16 is monitor light beam.

In the semiconductor LD 4, the ratio of the amount of the front light 15 to the rear light 16 is fixed. Therefore, the power average value of the transmission light (front light 15) of the semiconductor LD 4 can be kept always constant by receiving the rear light 16 of the semiconductor LD 4 using the monitor PD 5 and by controlling a drive circuit of the semiconductor LD 4 so that the monitor PD's photocurrent output may become constant. Since the light intensity of the LD varies over a long period of time, a monitor PD for monitoring it is indispensable for the optical transmitter.

Since the metal package has been used, the optical transmitters shown in each of FIGS. 1 through 3 have been good in hermetic sealing, and satisfactory in emission output and amount of monitoring light. However, since they have a three-dimensional structure, axis alignment has been necessary for positioning the cap 13 with the lens and the optical fiber. Additionally, since assembling may have been time consuming, assembly costs have been high. Further, since the lens for condensing light and the coaxial metal package have been used, there have been a limit in miniaturizing its size and reducing costs.

An optical communication device having a two-dimensional structure and not requiring axis alignment adjustment has been studied. This is called a surface-mountable optical communication device because a planar waveguide is installed on a substrate. This device has a two-dimensional structure, is small in size, and has a short optical path, and therefore no lens required, and so axis-alignment work requiring much time has become unnecessary. Additionally, there is a possibility that components and assembly costs can be reduced. Such an optical communication device may exactly meet the purposes of size and cost reductions. Since the LD light emitting a signal light beam is not allowed to vary even in case of the surface-mountable transmitter, the monitor PD must monitor the amount of the LD light.

If a PD performing edge illumination is used as the PD for monitoring the LD light, the LD and the monitor PD may be directly mounted on the substrate while adjusting their height. For example, there have been waveguide type PD or an edge-incident type PD whose end face being slanted. The height of the LD and the PD can be adjusted by mounting them on the substrate while directing their respective epitaxial layer surface toward the substrate. The rear light having horizontally emitted from the LD directly illuminates the end face of the PD, thereby making it possible to generate a monitor current in the PD.

However, these PDs are unique and so have been difficult to be manufactured at low cost. Further, if these PDs are used, only a part of the LD light enters the PD because an active area is too narrow. In short, disadvantageously, the coupling efficiency of the LD is low, and the amount of monitor light is slight. All that is needed for accurate monitoring is to enhance the responsivity of the PD or increase the amount of the rear LD light.

In order to achieve cost reductions, it is absolutely necessary to use, as a monitor PD, a rear- or top-incident PD, which can be easily manufactured. These have requirements of causing a light beam to enter from a rear or top face.

A possible method for horizontally disposing the LD and causing the light to enter from the rear or top face of the PD is considered to mount the PD sideways, for example.

In case of the top-incident PD, it is possible to set up a pole on the substrate and then mount the PD sideways on the side face of the pole. Thereby, the rear light (monitor light) of the LD can enter from above the top face of the PD at a right angle. Also, in case of the rear-incident PD, it is possible to set up a pole on the substrate and thereafter fix the rear-incident PD thereto so that the light to enter from the rear face thereof. However, in order to do so, there is a need to install the pole onto the substrate, thus having complicated the structure of the substrate. Since light that has emitted from the LD radially spreads as a result of propagation, a lens for converging it may have been needed. Further, wiring patterns are complicated, and a quite number of parts and man-hours have been required, and, as a result, the advantages of the surface-mountable type may have been decreased. It is contrary to cost reductions to set up the pole on the substrate and complicate the device structure.

Under the situation where the LD is horizontally disposed, and the rear-incident PD that is placed horizontally on the substrate is used as a monitor PD, some measure is needed to guide the light of the LD to the rear face of the PD. For example, (1) German Patent DE4313492C1 discloses a structure in which a V-groove is formed on a substrate surface just behind an LD mounted surface thereof directing its epitaxial layer toward the substrate, and a rear-incident PD is disposed as a monitor PD so as to step over the V-groove. According to this structure, the rear light of the LD is reflected by the V-groove, is thereafter directed upward, and reaches a detecting area of the PD from the rear face thereof. Here, the LD and the PD are coupled to each other merely by the V-groove having been cut between the LD and the PD. However, in such a surface-mountable LD module (optical transmitter), a part of the LD rear light travelling toward the upper half does not enter the PD. That is, a disadvantage resides in the fact that travelling light toward the PD is less than half the rear light of the LD, and therefore coupling efficiency is low.

(2) Japanese Unexamined Patent Application Laid Open No. 1980-341062 discloses an LD module that an LD and a PD are horizontally mounted on an intricately shaped substrate having grooves, a chamfer, and stepped parts, and the rear light of the LD is guided to the rear-incident PD. FIG. 4 shows its structure. An Si substrate 17 is a single-crystal silicon (Si)substrate, and has a complicated shape. A narrow platform is provided at the central part, and a triangular groove 18 is formed behind this. The back of the substrate behind the groove 18 is a diagonally cut chamfer 19. A light-emitting element (LD) 20 is horizontally mounted on the narrow platform at the center. A high rear-tall portion 21 is provided just above the chamfer 19.

The rear-tall portion 21 is flat, on which a rear-incident monitor PD 22 is mounted. The rear half surface of the sectional triangular groove 18 is coated with an antireflection (AR) coating 23. A metal coating (reflecting mirror) 24 is formed onto the chamfer 19. A V-groove has been cut in front of the LD 20, and an optical fiber 25 is inserted and fixed there. The LD 20 (light emitting element) emits front light (signal light) and rear light (monitor light). The power ratio thereof is fixed.

The signal light 29 (front light) enters the optical fiber 25, and is propagated therethrough. The monitor light 28 (rear light) travels through the groove 18 downward, passes through the AR coating 23, enters and travels through the substrate, then being reflected by the metal coating 24 of the back, then enters the rear face of the monitor PD 22, and is detected thereby. The magnitude of the signal light can be detected by monitoring the light received by the PD 22. Since the monitor PD can detect the decrease in the LD light due to aging change, a current for driving the LD may be increased proportionally with the decrease, and thereby the strength of the LD signal light being kept constant. This was a novel idea in that the monitor light can travel through the Si substrate.

Si is obscure to visible light, but is almost transparent to signal light of 1.3 $\mu$m or 1.55 $\mu$m, and therefore can allow the rear light of the LD 20 to pass through the interior of the Si substrate. Thus, such a structured surface-mountable module had not been theretofore found. Moreover, it was a contrivance that had surprised a person skilled in the art, as it is the method of diagonally chamfering the bottom surface of the substrate 17 (see reference character 19), then processing the mirror 24 (metal coating) thereby reflecting the monitor light upward. Thus, the rear light 28 of the LD can be guided to the rear face of the PD horizontally mounted on the substrate. The excellent idea made in this proposal resides in the fact that light can be guided from the LD to the PD both chips horizontally mounted on the substrate.

This method may be a promising candidate, because it is possible to successively mount an optical fiber, a semiconductor LD, and a monitor PD on a small bench utilizing surface mount technology, with a lens not needed, and there is a possibility of enabling size and cost reductions.

However, according to this method, the Si bench must be subjected to groove and chamfer processing, and such processing of the Si bench is complicated. It is disadvantage of this method. Since the height of the rear-tall portion 21 on which the PD is placed is greater than that of an intermediate part on which the LD 20 is placed, steps having such a level difference must be formed. Further, the groove 18 must be formed in the intermediate part, and the chamfer 19 and a mirror 24 must be formed on the back of the rear substrate. Especially, oblique processing of the rear chamfer 19 and processing of the metallic reflection coating 24 increases man-hours. The difficult processing leads to a great rise in the manufacturing costs of the module.

There is still another disadvantage in addition to the aforementioned. It is that the coupling efficiency between the LD 20 and the PD 22 is lower than that of Prior Art (1). In other words, the rear light 28 of the LD 20 only partly enters the monitor PD 22.

This can be understood from extremely simple consideration in terms of geometrical optics. The emission point of the rear light of LD 20 is designated as $L_2$. The base of the rear-incident PD 22 is designated as CG, and the middle point of CG as N. The side of the mirror is designated as EF. The downward angle of the rear light 28 that has emitted from the LD 20 forming an optical axis is designated as $\phi$. The downward angle $\phi$ is a variable. The point where a part of the rear light striking the middle point N of the PD having been reflected by the mirror 24 is designated as M. M is situated at almost the center of EF, but is not the middle point. The slanting angle of the mirror surface is designated as $\beta$. $\beta$ is a constant. In the FIG. 4, light striking the middle point N of the PD is shown so as to be perpendicular to the bottom surface of the PD. In the intermediate point M of the mirror, an x-axis is set sideways, and a y-axis lengthways. The horizontal distance between the emission point $L_2$ of the rear light of the LD 20 and the intermediate point M of the mirror is designated as s, and the vertical distance therebetween as h. The distance between the mirror intermediate point M and the middle point N of the PD is designated as k. k is greater than h (k>h). The mirror surface having a slanting angle of $\beta$ is expressed by the following linear equation.

$$x \sin \beta - y \cos \beta = 0 \tag{1}$$

The back surface of the PD is expressed by the equation (y=k).

The light beam emitted from the LD at an emission angle of "$\phi_0 = \cot^{-1}(s/h)$" is reflected at the mirror intermediate point M(0,0), and strikes the middle point N(0,k) of the rear face of the PD. Presumably, when $\phi=0$, the light beam is maximum and shows the Gaussian distribution therearound. However, the light beam has a certain degree of strength even in the vicinity of $\phi_0$. A reflection angle at the point M is equal to the slanting angle $\beta$, and an incidence angle at the point,where M is $\pi/2-(\phi_0+\beta)$. Accordingly, the following equation is obtained if assumed these being equal to each other.

$$2\beta = \pi/2 - \phi_0 \tag{2}$$

The emission angle $\phi$ of the LD light where the light beam striking an arbitrary point (x, k) of the bottom surface of the PD is given by following equations.

$$\phi - \phi_0 = \tan^{-1}(x/(k+q)) \tag{3}$$

$$q^2 = h^2 + s^2 \tag{4}$$

It is understood that, since the distance "k+q" is long, only light falling within the narrow range of the emission angle φ can enter the PD. Equation (3) can be approximated like "$\phi-\phi_0 \approx x/(k+q)$". Then, the range of the emission angle φ detected by the PD is:

$$|\phi-\phi_0| \leq D/\{2(k+q)\} \qquad (5)$$

where D is an effective diameter of the detecting area in the PD.

Let the effective diameter D of the PD be 200 μm, and k+q=3000 μm. Then, $|\phi-\phi_0|$ is 0.032 radians (=2 degrees). If $\phi_0$=10 degrees, for example, then only the rear light whose emission angle being 8 through 12 degrees enters the PD. This indicates that the longitudinal light beam divergence of the LD is approximately 20 trough 30 degrees, out of which only light beams travelling in extremely limited directions can enter the PD.

Above all the strongest LD light in the vicinity of zero (0) degrees can not be caught. Therefore, most of the rear light of the LD becomes useless. It is to be understood that the coupling efficiency between the PD and the LD is low.

Prior Art (2) may be dominated by a preconceived idea that both the semiconductor LD and the monitor PD might be horizontally mounted. If the chips are horizontal to the substrate surface, chip mounting and wire bonding can be easily performed. Therefore, the structure shown in FIG. 4 may have been inevitably employed.

However, in order to make more use of the surface mount technology further, it is preferable to dispose a simpler monitor PD. In other words, it is preferable to employ a simple structure without a plurality of grooves having not been cut, and a mirror nor an antireflection coating having not been formed. In addition, such a structure is expected as most of the rear light of the LD can strike the PD by enhancing the coupling efficiency between LD and PD.

(3) Japanese Unexamined Patent Application Laid Open No. 1997-26529 discloses a structure that the signal light beam of an optical fiber is received by a rear-incident PD with a lens having been slantingly fixed, as shown in FIG. 9 of this publication. However, this is not a light receiving monitor PD but a signal light receiving PD. Accordingly, it is necessary that the response speed be high, and it is impossible to enlarge an active area for it. FIG. 9 of this publication shows an active area whose radius is 30 μm. A lens is indispensable to be provided in order to gather light in the small active area. However, it is difficult to fix the lens so as to adjust the focus of the lens at the active area of the PD. Additionally, since the optical fiber cannot be stably positioned, axis alignment is needed. However, the position of the optical fiber is often deviated despite the axis alignment. The structure disclosed has not be reduce costs. In the optical fiber, its polarization plane rotates because of mechanical shock, temperature variation, and pressure change. A slanting face incidence method, heavily polarization-plane dependent, has a disadvantage in that its responsivity tremendously varies due to the influence of the polarization plane rotation.

DISCLOSURE OF INVENTION

In an optical transmitter in which the quantity of light of an LD is monitored by a monitor PD, and the power of the LD is kept constant by feedback, the present invention aims to provide an optical transmitter that is capable of resolving the aforementioned disadvantages of the conventional devices, that is suitable for size and cost reductions while being able to input greater amount of the LD light into the monitor PD, and that is capable of performing higher-bit-rate transmission. The present invention is characterized in that a concave groove is formed in a substrate, and the monitor PD is mounted on a slanting face of the concave groove, and a light of the LD being oppositely and horizontally disposed can be received directly by the monitor PD. However, the monitor PD contains an antireflection coating, as described later.

The present inventors have found that the monitor PD does not necessarily have to be horizontally disposed. The method of such horizontal arrangement may have resulted from a preconception that a chip should be horizontally disposed for bonding. However, it is possible to subject the slanting face to die-bonding even if the PD is not horizontal. A slanting electrode pad and metallized substrate can be subjected to wire-bonding through an ingenious manner. Both die- and the wire-bondings can be applied to the slanting chip, depending on the method to be adopted.

If the chip does not need to be disposed horizontally to the surface of the substrate, the degree of freedom concerning the holding of the monitor PD will be enhanced. That is, the degree of freedom can be obtained when it is fixed while being slanted. A simpler PD-holding structure can be made by the degree of such freedom being slanted.

According to the present invention, a concave groove having an oblique wall is formed in a Si substrate, and a monitor PD is mounted on the slope of the concave groove facing an LD, so that the rear light of the semiconductor LD may directly strike the monitor PD. The term "directly" means that the light does not pass through an optical system such as lens or mirror, and the rear light of the LD directly enter the monitor PD without being reflected. Therefore, most of the rear light of the LD can be input to the monitor PD. The coupling efficiency between the monitor PD and the LD can be remarkably raised. Fluctuations in the output power of the LD light can be detected more sharply, and the LD power can be controlled more precisely. A condensing means like a lens can be made unnecessary by shortening the distance between the LD and the monitor PD, and by using a PD whose active area being relatively large as a monitor PD. Since what is needed for monitoring is an average value of receiving light, a response speed does not need to be so high, and so the PD whose active area being relatively large can be used. Further, since the distance between LD and monitor PD is short, the entire module can be made smaller in size. Since a reflection wall and a mirror do not need to be processed, manufacturing costs can be reduced.

The key point of the present invention resides in the fact that the monitor PD is slantingly mounted at a predetermined oblique angle, and the rear light of the LD is caused to directly enter the oblique monitor PD.

The "oblique angle" mentioned here is the angle between a plane including an optical axis of the LD rear light and being parallel to the surface of the substrate, and the active area of the PD. Let the oblique angle be α.

If the oblique angle α is too small, an anticipated angle in the active area becomes small, and the amount of incident light decreases remarkably. Especially in the slanted face, the polarization-direction dependence upon the amount of receiving light becomes dominant, and so practical use becomes difficult. On the contrary, if the oblique angle α is too large, wire-bonding for current conduction to an electrode on the side of the active area of the PD becomes difficult.

Therefore, preferably, the oblique angle of the monitor PD falls within the range 15 through 50 degrees. The present invention differs from any conventional module in disposing the monitor PD slantingly. Oblique mounting makes it possible to use either rear- or top-incident PD Thus coupling efficiency is by far superior.

Although processing for forming the oblique wall is necessary, this is an easier step than Prior Art (1) and Prior Art (2). The LD, the monitor PD, and the concave groove are covered with resins transparent to the light of the LD (transparent resin). A transparent resin having a refractive index close to that of the LD or that of the monitor PD is suitable. The exterior of the transparent resin is first shaped, and is then sealed with, for example, an epoxy resin by which hermetic sealing can be achieved.

As described above, in the present invention, the concave groove is provided just behind the LD, and the monitor PD is slantingly fixed onto the wall of the concave groove, thereby guiding the rear light of the LD directly to the oblique monitor PD. Since the monitor PD is designed to receive most of the LD power, the LD can be controlled stably. The monitor PD is disposed in close vicinity to the LD, and the monitor PD has a relatively large active area, and therefore a lens is unnecessary. Since the structure is simple, an optical transmitter can be manufactured with fewer components and by simpler manufacturing steps. Size and cost reductions can be achieved. Monitor current can be also obtained stably, and high-bit-rate transmission can be performed by directly connecting the transmitter to a driver IC.

Although wire-bonding is a subject, a technique for subjecting an oblique metallized surface to wire-bonding has been known, and therefore, an element of such a structure can be manufactured.

BEST MODE FOR CARRYING OUT THE INVENTION

Figure 1:
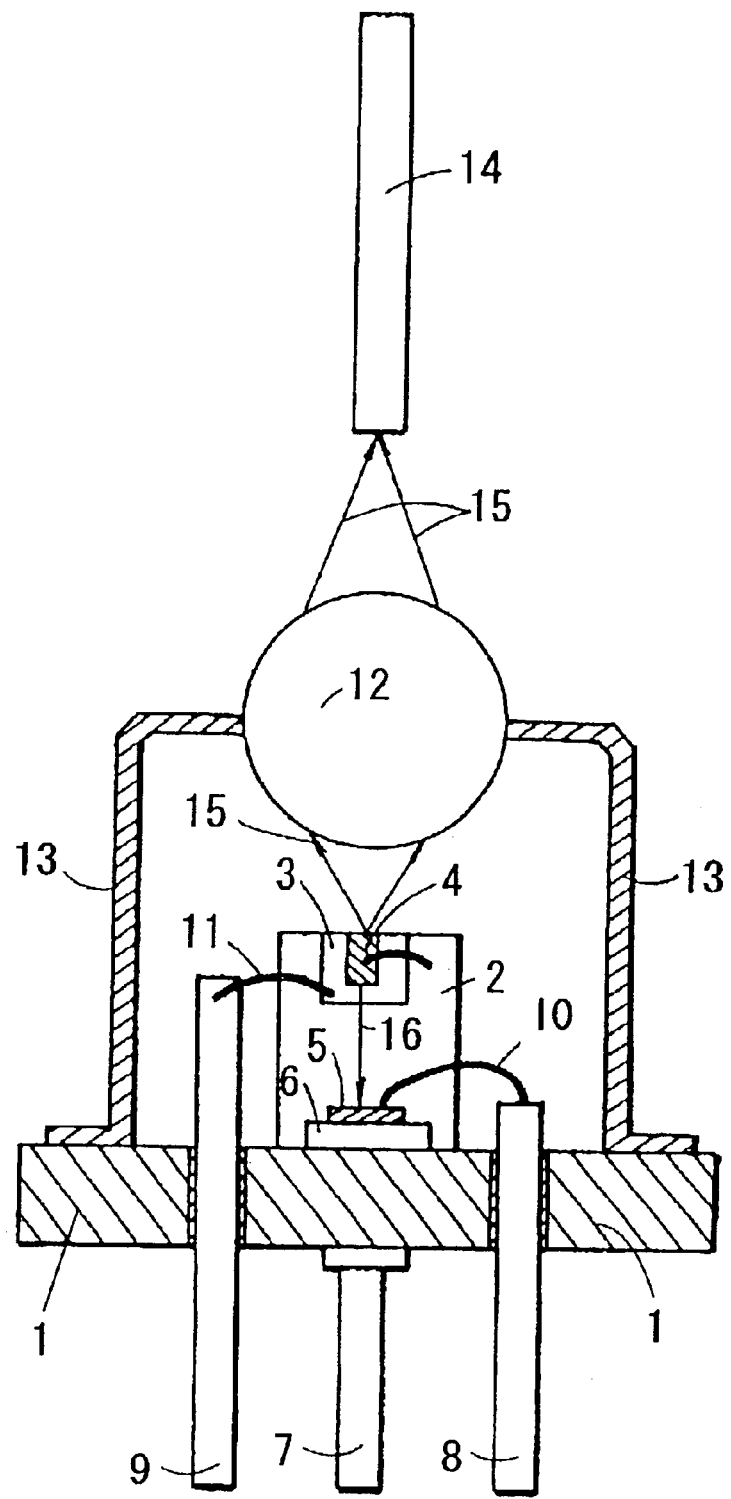
FIG. 1 is a longitudinal sectional front view of a conventional optical transmitter, having a three-dimensional structure, that is housed in a cylindrical symmetric metal package, whose outer shell part is omitted.
Figure 2:
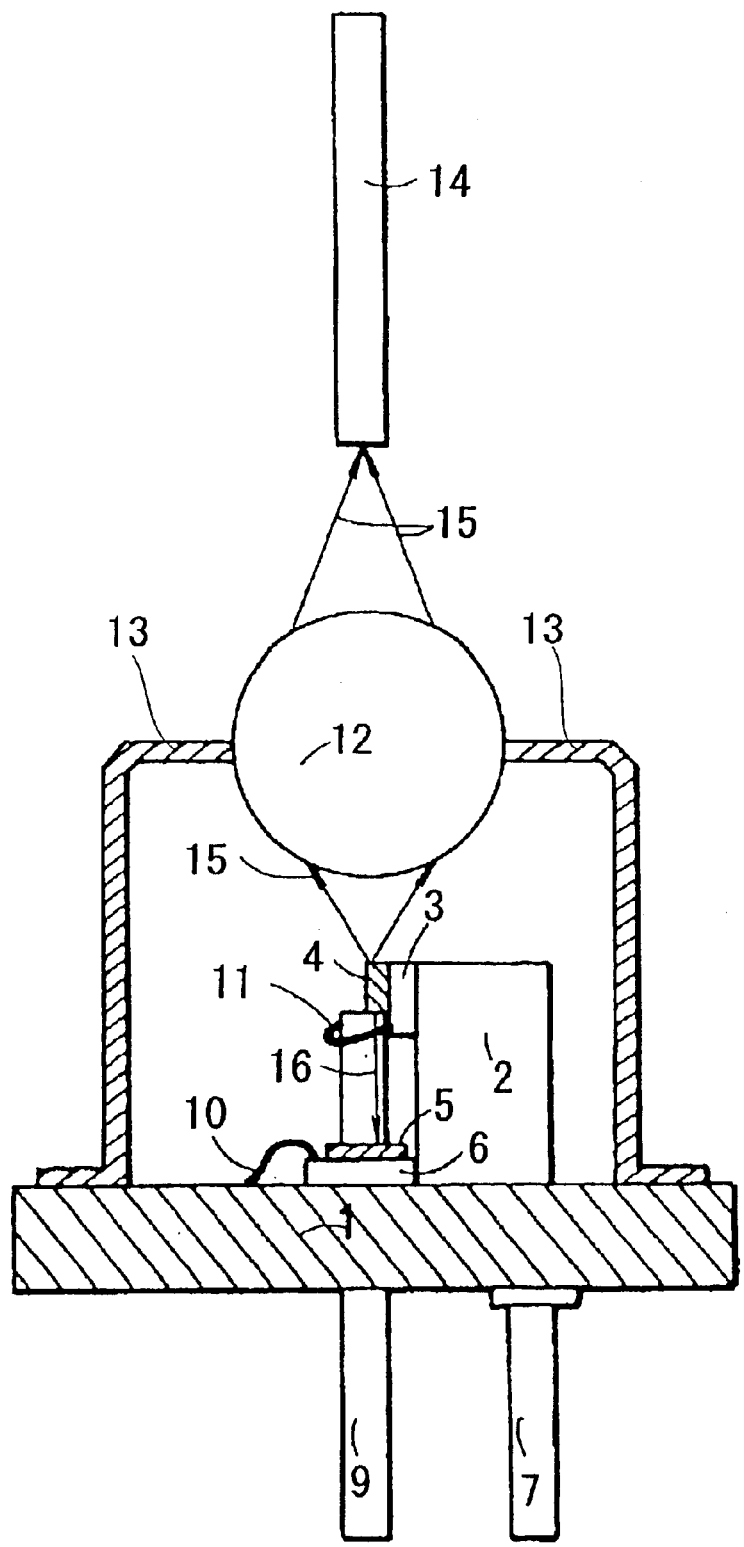
FIG. 2 is a longitudinal sectional side view of a conventional optical transmitter, having a three-dimensional structure, that is housed in a cylindrical symmetric metal package whose outer shell part is omitted.
Figure 3:
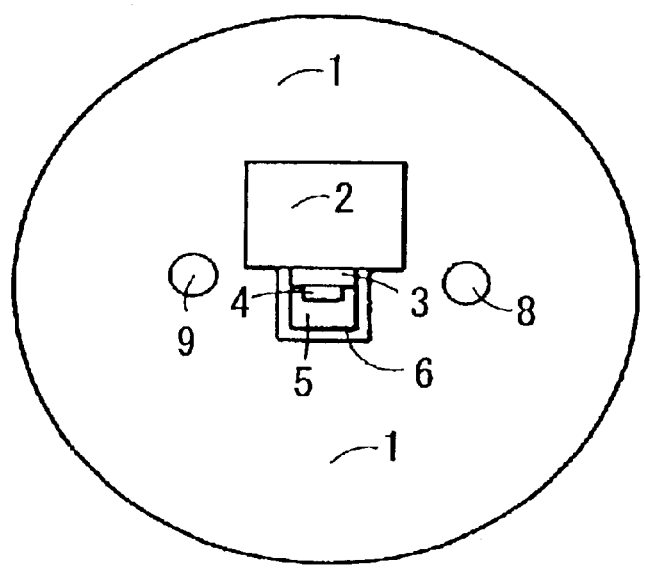
FIG. 3 is a transverse sectional plan view of a conventional optical transmitter, having a three-dimensional structure, that is housed in a cylindrical symmetric metal package, whose outer shell part is omitted.
Figure 4:
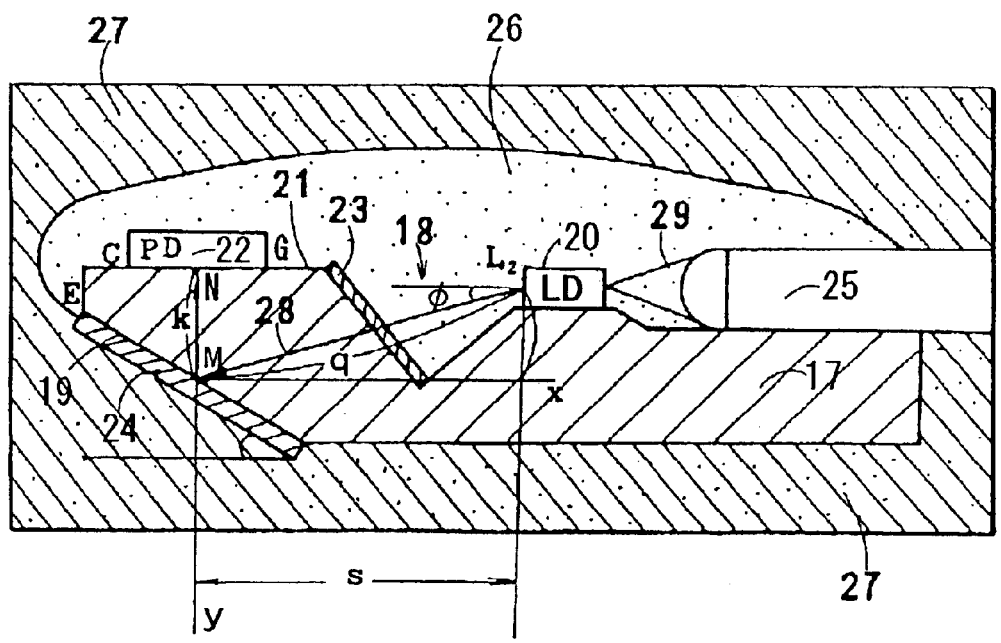
FIG. 4 is a sectional view of a light-emitting element module disclosed in Japanese Unexamined Patent Application Laid Open No. 1998-341062.
Figure 5:
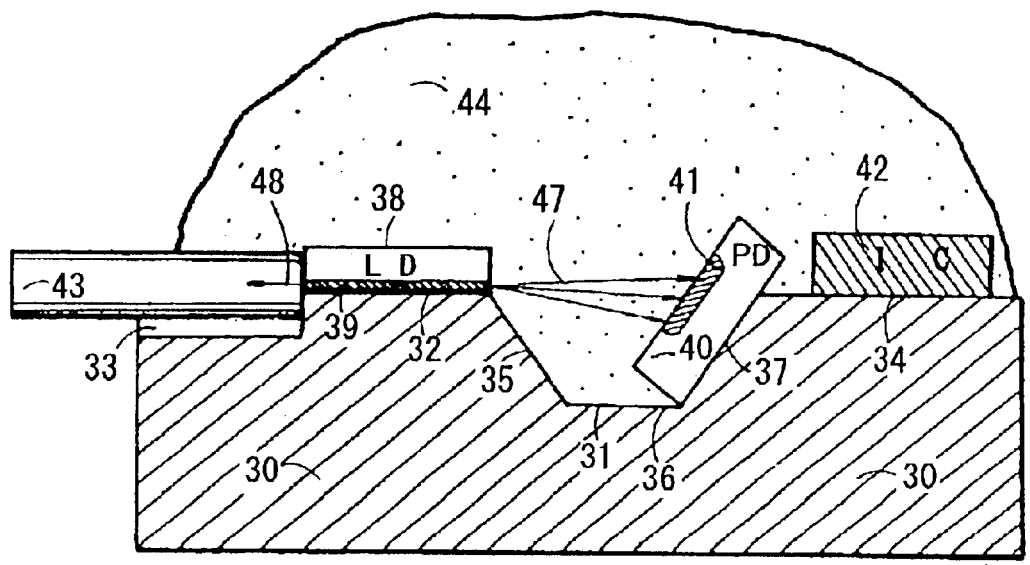
FIG. 5 is a longitudinal sectional view of an optical transmitter according to a first embodiment of the present invention using a top-incident PD.

Referring to FIG. 5, the structure of an optical transmitter of the present invention will be described. A concave groove 31 is provided in the vicinity of the center of a flat substrate 30. A flat front plane 32 is situated in front of the concave groove 31. A V-groove 33 for fixing an optical fiber is further provided in front of the front plane 32. A rear plane 34 is disposed behind the concave groove 31. The concave groove 31 has a front slanting face 35, an intermediate flat face 36, and a rear slanting face 37.

A semiconductor LD 38 is horizontally fixed to the front plane 32 just in front of the concave groove 31. This is mounted by directing a light-emitting portion 39 toward the side of the substrate. The reason why this is mounted as in the above is to facilitate axis alignment with an optical fiber.

A monitor PD 40 is fixed slantingly onto the rear face 37 of the concave groove 31. In the present invention, it is important that the monitor PD 40 be fixed slantingly at a predetermined oblique angle toward the LD 38. If the oblique angle α is too small, an anticipated angle in an active area becomes small, and the amount of incident light decreases remarkably. Especially in the slanted face, the polarization-direction dependence upon the amount of receiving light becomes dominant, and so practical use difficult. On the contrary, if the oblique angle α is too large, wire-bonding for current conduction to an electrode on the side of the active area of the PD becomes difficult. Therefore, preferably, the oblique angle of the monitor PD falls within the range 15 through 50 degrees.

The monitor PD 40 is either a rear- or a top-incident PD. An optical fiber 43 is disposed in the V-groove 33 in front of the semiconductor LD 38. A metallized wiring pattern connected to the LD 38 and the PD 40 is printed on the substrate surface, and the metallized pattern, the LD 38, and the PD 40 are connected by die- or wire-bonding. Herein, the wiring pattern and the wire are not illustrated in the drawings.

A part in the vicinity of the semiconductor LD 38, the optical fiber 43, the concave groove 31, and the monitor PD 40 is covered with a resin 44 transparent to light emitted by the LD 38. In FIG. 5, the light is propagated not through a space but through the interior of the resin. Although the present invention is, of course, effective for a structure having no resin, the resin enables to narrow divergence of the LD light, thus realizing a more effective structure. The transparent resin is occasionally called a potting resin. A refractive index of the transparent resin is preferably close to that of the LD 38 or the PD 40. The LD and the PD have an InGaAsP and/or an InGaAs layer(s) having been grown on the InP substrate, and serving to transmit or receive light.

In order not to cause reflection or scattering at an interface between the transparent resin and the PD, it is best to use a resin whose refractive index is equal to that of the PD. However, there is no transparent resin having such a high refractive index (beyond 3). A silicone-based transparent resin that has been usually used is a transparent resin having a refractive index close to that of an optical fiber, and it is preferable to form an antireflection coating, having a refractive index value intermediate between the refractive index of this resin and that of the PD, on the surface thereof.

This substrate is further bonded to a lead frame with a great many leads, not illustrated. The lead corresponding to a metallized pattern is connected by wire-bonding. An entire part thereof is further covered with resin used for firm fixation. For example, resin superior in hermeticity and rigidity, such as epoxy resin, is used. If a package used as an outer shell is separately prepared, a structure is formed, that the transparent resin is housed in the package having been fixed by the firmly fixing resin. This is a three-layer-coated structure including the transparent resin, the fixing resin, and the package.

Alternatively, it is permissible to employ a resin mold type package that the epoxy resin itself serves as an outer shell. This is a two-layer resin structure having transparent and fixing resins. As a result, an optical transmitter (LD module) is formed from which a plurality of pins and an optical fiber or ferrule projecting outside.

To the semiconductor LD 38, is given a pulse current, modulated by a signal by the IC 42 for driving. The LD 38 emits light forward and backward at a constant rate. A front light 48 is a signal light, and is transmitted outside through the optical fiber. The rear light 47 is a monitor light, and is caused to strike the monitor PD 40 disposed therebehind slantingly. It is transformed into a photocurrent here so as to obtain an average value, and then fed back to an IC for driving the LD, thereby keeping the level of the LD output light constant.

For substrate, Si, ceramics, or plastic, can be used. The concave and V-grooves can be formed through different method, depending on materials. In the case of the single-crystal Si substrate, the concave and V-grooves can be manufactured by anisotropic etching. In that case, the oblique angle of the concave groove is limited by a crystal orientation. In case of the ceramic substrate, the concave and V-groove can be mechanically manufactured by dicing. In case of the high polymer (plastic) substrate, the concave and V-grooves can be freely made by injection or press molding.

Figure 6:
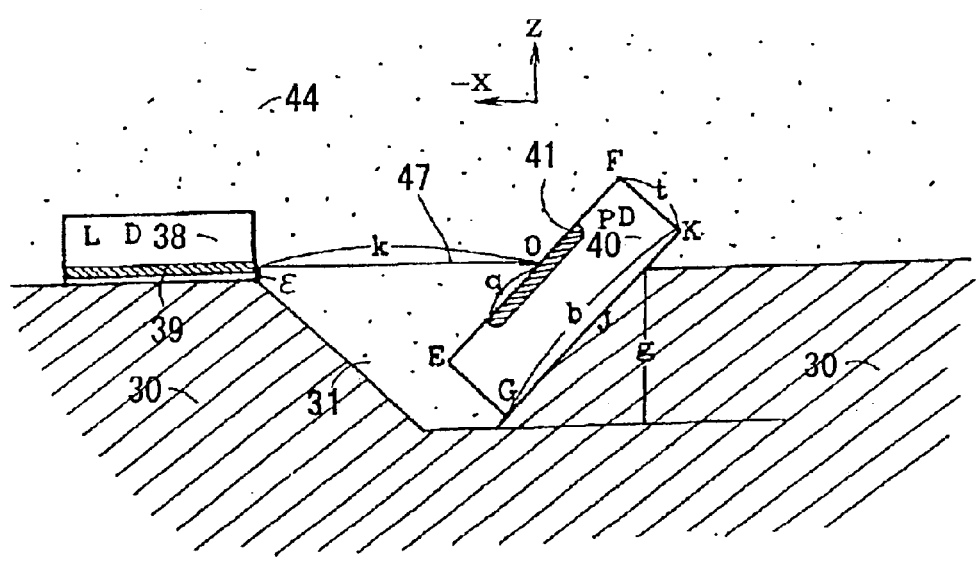
FIG. 6 is an enlarged view of an LD/PD part of the optical transmitter according to the first embodiment of the present invention.

As shown in FIG. 6, the depth "g" of the concave groove depends on the size of the PD chip 40. Let the width of the PD chip be "a", the length of the side be "b", and the thickness be "t". Let the oblique angle be "$\alpha$". "$\alpha$" is an oblique angle to a horizontal plane. If it is a top-incident one, and the horizontal light of the rear from the LD should strike a center of the top face, then the position of the PD is determined as follows. Let the height of the light emitting portion of the LD be zero (z=0). Let the center of the top face of the PD be an origin O. An "x" axis is set in the direction from the PD to the LD.

Since the PD is slanted only at an angle "$\alpha$", "x" and "z" coordinates of the front end point E(on the side of the LD), the center point O, and the rear end point F of the top face are expressed as follows:

Front end point E of top face $$x_e = (b \cos \alpha)/2, \quad z_e = (b \sin \alpha)/2 \tag{6}$$

Center point O of top face $$x_o = 0, \quad z_o = 0 \tag{7}$$

Rear end point F of top face $$x_f = (b \cos \alpha)/2, \quad z_f = (b \sin \alpha)/2 \tag{8}$$

Since the PD has a thickness "t", "x" and "z" coordinates of the front end point G (on the side of the LD), the center point J, and the rear end point K of the bottom face are expressed as follows:

Front end point G of bottom face $$x_g = (b \cos \alpha)/2 - t \sin \alpha \tag{9}$$

$$z_g = (b \sin \alpha)/2 - t \cos \alpha \tag{10}$$

Center point J of bottom face $$x_j = 0 - t \sin \alpha \tag{11}$$

$$z_j = -t \cos \alpha \tag{12}$$

Rear end point K of bottom face $$X_k = -(b \cos \alpha)/2 - t \sin \alpha \tag{13}$$

$$z_k = (b \sin \alpha)/2 - t \cos \alpha \tag{14}$$

If the depth "$z_g$" of the front end point G at the bottom face is smaller than the depth "g" of the concave groove, the PD can be fixed to the slope. Since the height of the light emitting point of the laser has been chosen as (z=0), the PD can be fixed to the rear slope if the following relation is satisfied:

$$(b \sin \alpha)/2 + t \cos \alpha \leq g + \epsilon \tag{15}$$

where $\epsilon$ is the height of the light emitting point from the substrate.

Since light of the exact center part (emission angle $\phi$=0) of the rear LD enter the exact center point O of the PD, most of the LD light can strike it if the oblique angle $\alpha$ is large. As the oblique angle $\alpha$ is reduced, the amount of light enter the PD decreases together with sin $\alpha$ value. However, the property of light always entering the center part of the PD can be maintained.

However, a certain degree of light is reflected by the surface because of a difference in the refractive index. The amount of reflection increases as the oblique angle $\alpha$ departs from 90 degrees.

However, since the distance between the LD 38 and the monitor PD 40 is short, a large amount of light can be caused to enter the PD because of narrow divergion of light beam, even in the small area.

[Centeral Part of a Gaussian Beam can Enter the PD]

According to the present invention, the center of the detecting area in the PD can be aligned with the center of the rear light of the LD. If the radius of the detecting area of the PD is designated as "q" (approximately 100 $\mu$m, for example), the detecting area is seen like an oval when seen from the center of the rear LD light. If a y-axis is set in a lateral direction, and a z-axis is set in a vertical direction, the detecting area exhibits elliptic distribution as expressed by the following equation:

$$\frac{y^2}{q^2} + \frac{z^2}{q^2 \sin^2 \alpha} = 1 \tag{16}$$

The area of this ellipse is $\pi q^2 \sin \alpha$. Let the distance from LD to PD be "k" (k=450 $\mu$m, for example). On the assumption that the rear light of the LD is a Gaussian beam whose standard deviation angle is $\xi_y$ in the y-direction and is $\xi_z$ in the z-direction, the distance standard deviation that has been projected onto the yz plane in a distance of k reaches $\xi_y k$ and $\xi_z k$. This is proportional to a divergence angle of the beam. Generally, is larger the divergence in the vertical direction (z direction) perpendicular to the light emission stripe of the LD. The rear light power dP(y,z) in a differential area dydz in a distance of k is expressed in the approximation of the Gaussian beam as follows:

$$dP(y, z) = \frac{1}{2\pi\xi_y\xi_z k^2}\exp\left(\frac{y^2}{2\xi_y^2 k^2} - \frac{z^2}{2\xi_z^2 k^2}\right)dydz \qquad (17)$$

The amount of light enter the detecting area of the PD out of the rear light beams of the LD can be obtained by integrating the above equation within the range of the ellipse of Equation (16). A computer can easily calculate this. "Nonexistence of reflection" shown in the table and in the graphs below indicates this amount. It is to be understood that the integration area becomes greater in proportion to sin α as α becomes greater, and therefore, an amount of light (P) increases.

Figure 10:
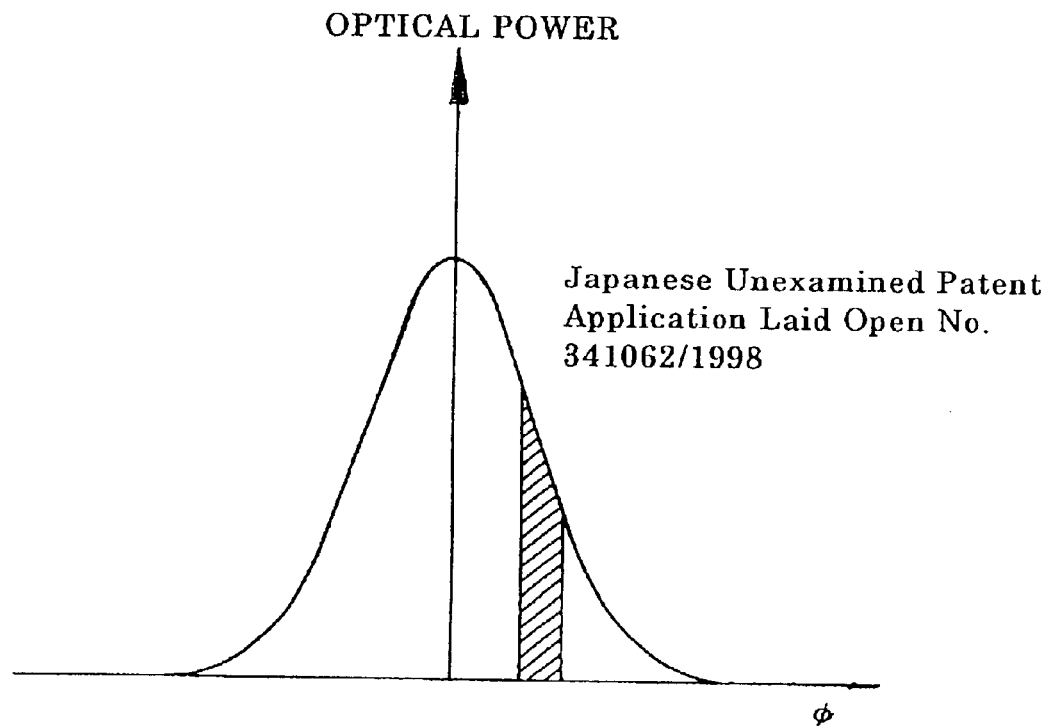
FIG. 10 is a graph showing angular distribution of a light beam that has been input to a monitor PD out of the rear light beams of the LD, in which only a part of the light on the periphery enters the PD, according to a method disclosed in Japanese Unexamined Patent Application Laid Open No. 1998-341062.
Figure 11:
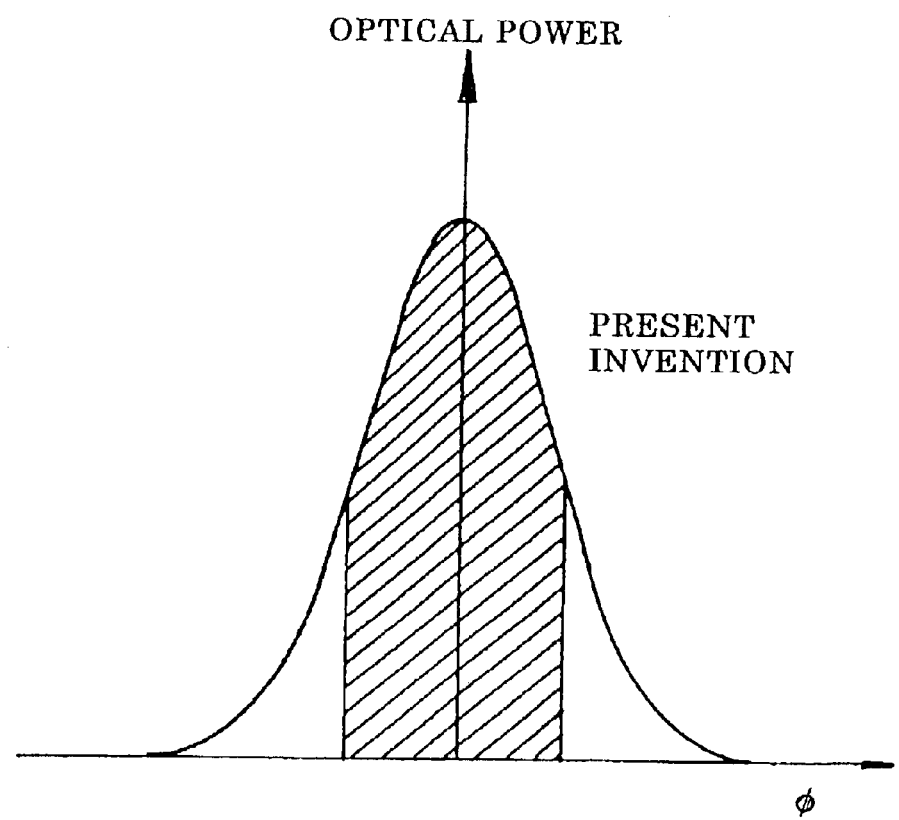
FIG. 11 is a view showing the angular distribution of a light beam that is input to a monitor PD out of the rear light beams of the LD that has been input to a monitor PD, in which light beams at the middle also enter the PD according to the present invention.

In Prior Art (2), only a part of non-center light out of the rear light of the LD enters the PD. FIG. 10 shows the Gaussian angular distribution of such a LD beam, out of which light entering the PD is shown by oblique lines. In contrast, FIG. 11 shows a LD Gaussian beam in the present invention, in which light that enters the PD is shown by oblique lines.

The amount of light entering the PD is larger in the present invention than in the prior art. The light of the center part enters the PD. The present invention is not characterized merely by the fact that the amount of light is larger. It is necessary to monitor a change in the amount of light at the center part of the LD in order to know a change in the total power of the LD The distribution of the ambient part greatly varies according to temperature and lasing conditions. The standard deviation angle also varies depending on temperature and aging change. In other words, the ambient distribution of the beam varies more easily than the center distribution. Therefore, if only a ambient part of approximately ten degree(10°) is observed as in Prior Art (2), the entire change in the amount of light cannot be accurately grasped. The change in the amount of the LD light is occasionally misunderstood. It is understood that the present invention that always covers the center part of the LD beam is by far superior to the prior art as a monitor.

A concrete calculation of light receiving efficiency is made as to the amount by which the rear light of the LD having struck the oblique PD enters the detecting area of the PD.

Figure 12:
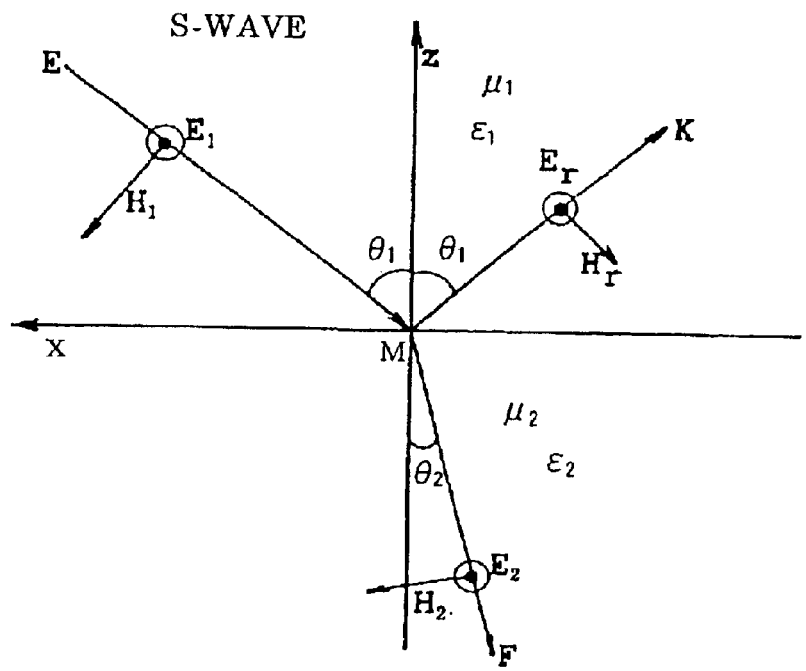
FIG. 12 is a graph showing vectors of electric and magnetic fields of S wave at the boundary plane between medium 1 and 2.
Figure 13:
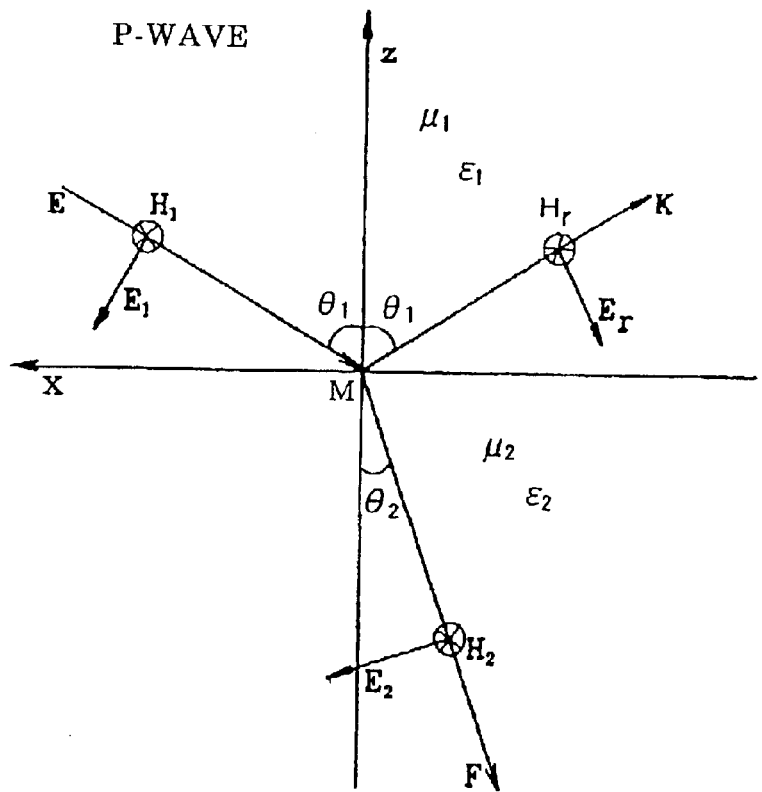
FIG. 13 is a view showing vectors of electric and magnetic fields of P wave at the boundary plane between medium 1 and 2.

As mentioned above, a calculation in case of "nonexistence of reflection" can be made according to Equations (16) and (17). In case of "existence of reflection", the refraction and reflection at the slanted face must be considered. All of the rear light of the LD having struck the oblique PD does not necessarily reach the detecting area of the PD. The reason is that reflection and refraction occur at the interface. The relationship between refraction and reflection has a slight difference between cases of S and P wave. In many cases, light having emitted from the stripe of the semiconductor LD has a lateral electric field which is parallel to the stripe. The lengthwise electric field which is perpendicular to the stripe is very small. Since the PD is disposed at an oblique angle of α with respect to the stripe surface, the refraction and the reflection at the PD almost concerns the S wave. FIG. 12 shows each respective direction of the electric field E, and the magnetic field H of the S wave, and FIG. 13 shows the same of the P wave. A description will be provided in case of the S wave referring to FIG. 12 as there is a similar relationship therebetween.

Let medium 1 and 2 be in contact with each other at the interface. Let each permittivity be $\epsilon_1$ and $\epsilon_2$, and let each permeability be $\mu_1$ and $\mu_2$, respectively. Let an angle (incidence angle) of a normal (z-axis) set up on the interface to incident light be $\theta_1$, an angle (reflection angle) to reflected light(refractive angle)be $\theta_1$, and an angle of refracted light to the normal be $\theta_2$.

The square root of the product of permittivity $\epsilon$ and permeability $\mu$ is called refractive index n. The refractive index of medium 1 and 2 are defined as $n_1=(\epsilon_1\mu_1)^{1/2}$ and $n_2=(\epsilon_2\mu_2)^{1/2}$, respectively.

An electric field component does not have a xz component in FIG. 12 because it is the S wave. That is, the electric field has only a y-direction component perpendicular to the sheet). The magnetic field is perpendicular to a vector K in the traveling direction and to the electric field. Moreover, E, H, and K are in a right-hand screw relationship. In other words, outer product(E×H) is parallel to the vector K in the traveling direction. It can also be said that outer product (H×K) is parallel to E. Therefore, assuming that the electric field $E_1$ of incident light, the electric field $E_r$ of reflected light, and the electric field $E_2$ of refracted light are positive in the y-axial direction, the magnetic field $H_1$ of incident light be an oblique downward vector, the magnetic field $H_r$ of reflected light an oblique downward vector, and the magnetic field $H_2$ of refracted light also become an oblique downward vector.

The transmittance to the PD can be calculated according to this Figure.

In case of "existence of reflection and nonexistence of antireflection coating", $T_0$ (transmittance) can be obtained according to the following equation:

$$T_0 = \frac{4\cos\theta_1\sqrt{M^2 + \cos^2\theta_1 - 1}}{\left(\cos\theta_1 + \sqrt{M^2 + \cos^2\theta_1 - 1}\right)^2} \qquad (18)$$

where $M=n_2/n_1$.

Light receiving efficiency W(α) can be obtained by substituting the above for Equation (19).

$$W(\alpha)=\int P(\phi)T_0(90-\phi)d\phi \qquad (19)$$

Integration falls within the range of φ around α.

The above is a strict calculation. However, since the oblique angle $\theta_1$ is roughly α, W(α) can be approximately calculated according to the following equation 20 by regarding $T_0$ as a constant under the condition where $\theta_1=\alpha$.

$$W(\alpha)=P(\alpha)T_0(90-\alpha) \qquad (20)$$

W(α) is calculated concerning the case of "existence of reflection and existence of antireflection coating".

Figure 9:
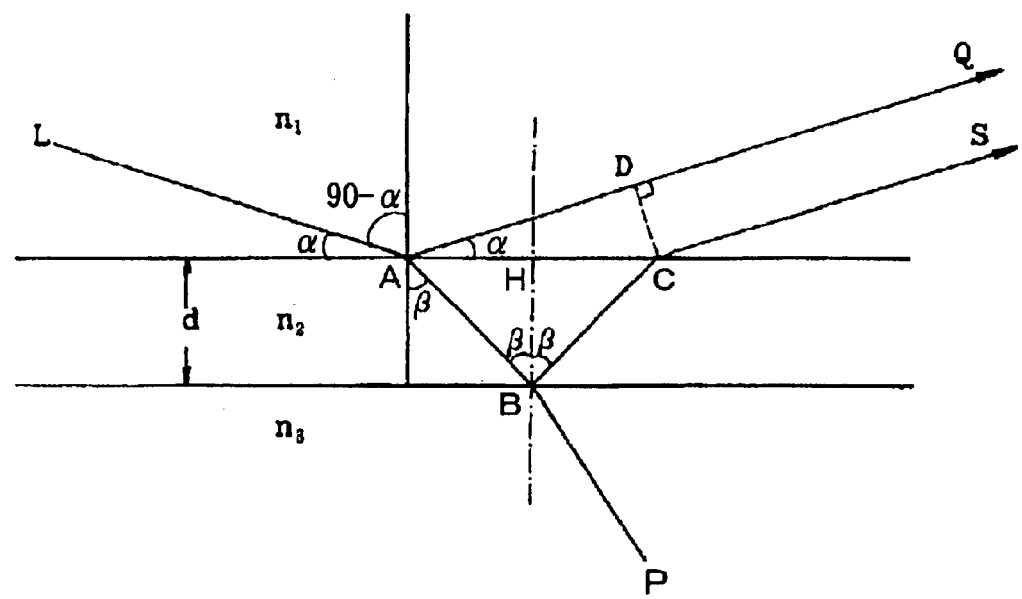
FIG. 9 is a view for explaining thickness design of an antireflection coating.

Light can increasingly enter the PD by disposing the antireflection coating on the PD chip. Consideration is given to the formation of a layer of antireflection coating. A description is given with reference to FIG. 9. Let it be assumed that the LD light enters an antireflection coating (refractive index $n_2$) from a transparent resin (refractive index $n_1$) at an oblique angle of α. Let the base of the antireflection coating be PD, and the refractive index thereof be ($n_3$). Since it is the antireflection coating, $n_2$ has a refractive index intermediate between $n_1$ and $n_3$. The antireflection coating does not completely prevent reflection. This is designed under the condition that the difference is 180° in phases between reflected light at the surface of the film, and reflected light at the boundary between the film and the ground. Let it be assumed that light L of the LD having an oblique angle of α to the antireflection coating is reflected at point "A" of the antireflection coating and travels in a direction LAQ. There is also a light beam entering the interior of the antireflection coating at point "A", then reflected by the surface of the PD (refractive index $n_3$), and travels in a direction of LABCS. A condition is given that the difference ΔL in optical path length between AD of surface-reflected light and ABC of internal reflected light should be a half-wave length λ/2. This is the condition reflected light beams are counteracted with each other. This is a condition the thickness of the antireflection coating is determined. The optical path length results from multiplying the length by the refractive index.

It is expected that the amount of light entering the PD will be increased by such antireflection coating to be formed on the PD surface. However, this antireflection coating cannot completely prevent reflection, and therefore all of the light does not enter the interior of the PD. Let it be assumed that $N_1 = n_1 \cos\theta_1$ and $N_3 = n_3 \cos\theta_3$. $T_1$ is calculated according to Equation(22) by the use of $S_1$ of the following equation, and $W(\alpha)$ can be obtained by substituting this for Equation (23).

$$S_1 = \frac{2}{\frac{n_2\cos\theta_2}{n_1\cos\theta_1} + \frac{n_3\cos\theta_3}{n_2\cos\theta_2}} \quad (21)$$

$$T_1 = N_3 S_1^2 / N_1 \quad (22)$$

$$W(\alpha) = \int P(\phi) T_1 (90 - \phi) d\phi \quad (23)$$

However, since the oblique angle $\theta_1$ is roughly α, $W(\alpha)$ can be approximately obtained according to the following Equation(24) by regarding $T_1$ as a constant under the condition that $\theta_1 = \alpha$, as in the case of "existence of reflection and nonexistence of antireflection coating".

$$W(\alpha) = P(\alpha) T_1 (90 - \alpha) \quad (24)$$

Figure 7:
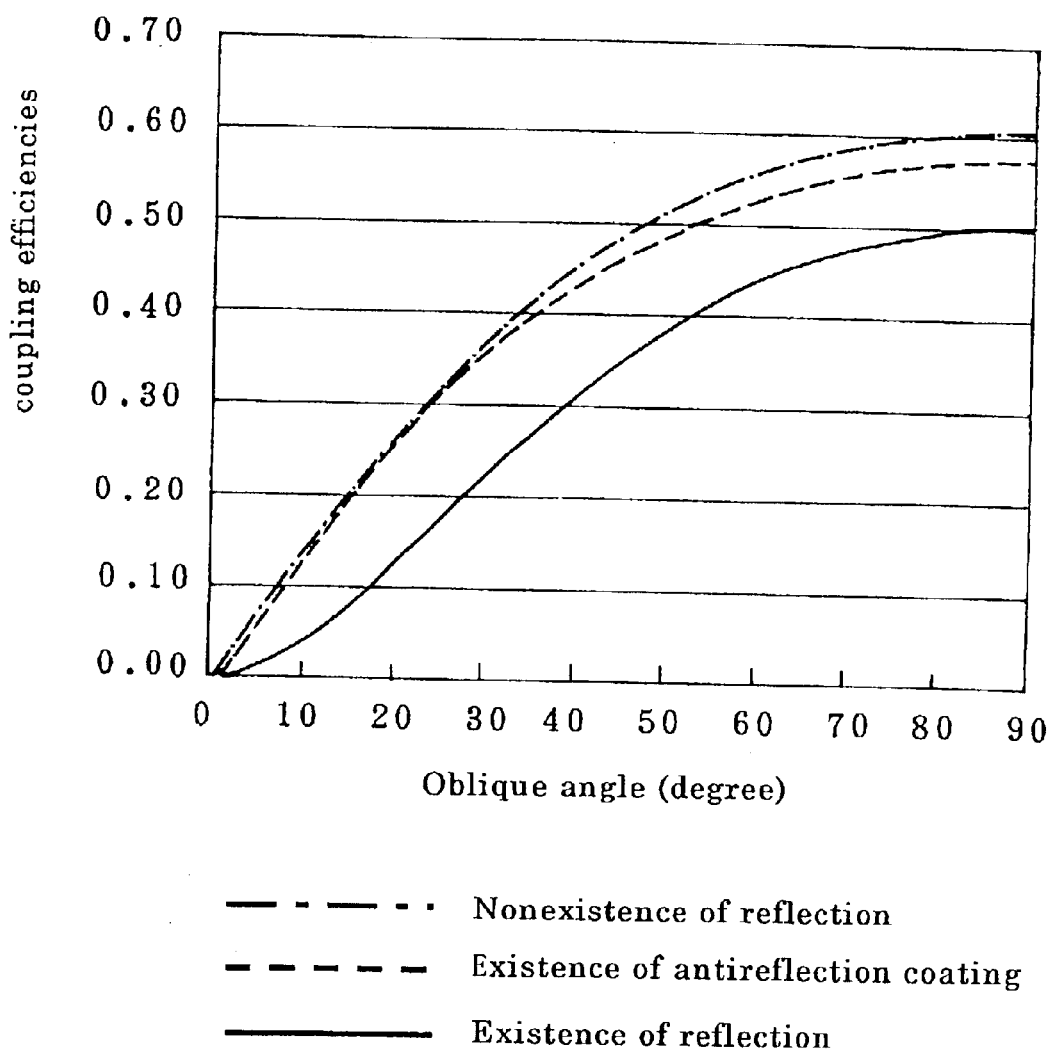
FIG. 7 is a graph showing the relationship of the oblique angle α of the PD to the coupling efficiency between LD and PD in the optical transmitter of the present invention, where a horizontal axis denotes the PD's oblique angle and a vertical axis denotes coupling efficiency, and further showing calculation results concerning three cases namely, non-existence of reflection, existence of reflection, and existence of an antireflection coating.

Table 1 shows an example in which concrete conditions have been put above-mentioned formulae, and calculations have been made with a computer. FIG. 7 shows its graph.

The concrete conditions that have been used are: the LD wavelength is 1.3 μm, the PD light receiving diameter 200 μm (0.2 mm), the distance k between the rear end face of the LD and the surface center point of the PD 400 μm (k=400 μm), the refractive index of the PD 3.5, the refractive index of rent resin 1.46, and the refractive index of antireflection coating 1.8.

TABLE

Light receiving efficiency of the monitor PD of the present invention.

| Oblique angle α (degree) | Thickness of antireflection coating (μm) | Coupling efficiency | | |
|---|---|---|---|---|
| | | Nonexistence of reflection | Existence of reflection | Existence of antireflection coating |
| 0 | 0.311 | 0.000 | 0.000 | 0.000 |
| 5 | 0.309 | 0.070 | 0.011 | 0.055 |
| 10 | 0.302 | 0.138 | 0.039 | 0.134 |
| 15 | 0.293 | 0.203 | 0.079 | 0.202 |
| 20 | 0.281 | 0.263 | 0.126 | 0.260 |
| 25 | 0.268 | 0.319 | 0.175 | 0.311 |
| 30 | 0.256 | 0.369 | 0.224 | 0.355 |
| 35 | 0.243 | 0.413 | 0.270 | 0.394 |
| 40 | 0.232 | 0.452 | 0.313 | 0.429 |
| 45 | 0.222 | 0.485 | 0.351 | 0.460 |
| 50 | 0.213 | 0.514 | 0.385 | 0.486 |
| 55 | 0.206 | 0.538 | 0.414 | 0.509 |
| 60 | 0.199 | 0.558 | 0.439 | 0.528 |
| 65 | 0.194 | 0.574 | 0.459 | 0.544 |
| 70 | 0.189 | 0.588 | 0.476 | 0.557 |
| 75 | 0.186 | 0.598 | 0.489 | 0.567 |
| 80 | 0.184 | 0.605 | 0.498 | 0.574 |
| 85 | 0.182 | 0.609 | 0.503 | 0.578 |
| 90 | 0.182 | 0.611 | 0.505 | 0.580 |

[Embodiment 1; α=45° (Top-incident PD)(FIGS. 5 and 6)]

A module having a structure of FIG. 5 was manufactured. A substrate used herein is a ceramic substrate of alumina ($Al_2O_3$) of 4 mm in length, 3 mm in width, and 1.2 mm in thickness.

First, a fixed groove 33 for an optical fiber, the metallized pattern for fixing a semiconductor LD, and a concave groove 31 for fixing the monitor PD were formed on the substrate. The metallized pattern could be formed by printing, vapor deposition, or sputtering. Since a space at the rear part of the substrate exists, a driver IC can be mounted there. When a driver IC 42 had been mounted, a metallized pattern for the driver IC was provided together therewith. If the driver IC is mounted, the device can be used for the high-bit-rate transmission of 5 Gbps to 10 Gbps because the distance to the LD is extremely short. However, the driver IC can, of course, be omitted. If so, since a driver IC is disposed outside, the driver IC and the LD are connected to each other through a lead.

If a substrate material is ceramic like alumina, the grooves (V-groove 33 and concave groove 31) can be formed by dicing (machining). If it is a silicon (Si) single-crystal substrate, the grooves can be formed by chemical etching. If it is a high polymer substrate, the grooves can be formed by press or injection molding.

The metallized pattern can be formed also by printing. In addition, in case of, for example, a two-layer structure of gold/chromium (Au—Cr), there is a method of covering the substrate with a Cr layer with vapor deposition or sputtering, and then applying Au-plating onto the Cr thin film so as to form an Au/Cr metallized pattern.

The semiconductor LD that was used here is a laser whose emitted-light wavelength is 1.3 μm and in which InGaAsP is used as a lasing layer. The chip size is 0.3 mm×0.3 mm×0.12 mm$^r$.

The light emitting portion was disposed toward the side of the substrate so that self-alignment with a core of the fiber can be performed.

The monitor was a PD of InGaAs. This is responsive to both light of 1.3 μm and 1.55 μm. The diameter of the detecting area was 0.2 mm, and the chip size 0.4 mm×0.4 mm×0.12 mm$^r$. A silicon nitride (SiN) thin film (antireflection coating) was formed on the light-receiving surface with vapor deposition so that a film thickness may become optimum for the light of 1.3 μm when striking at an angle of 45 degrees. Alternatively, the monitor can be a PD of InGaAsP.

The concave groove was formed by dicing at an oblique angle (α) of 45 degrees.

FIG. 6 is a sectional view of the groove, the PD, and the LD. The groove is approximately 0.6 mm in length and approximately 0.25 mm in depth.

If the center of the light-receiving diameter of the monitor PD is designed so as to substantially coincide with the extension of the optical axis of the rear light of the semiconductor LD as shown in FIG. 6, the most powerful light can be easily and abundantly received.

An epoxy resin can be used to fix this monitor PD, and also the metallized pattern of Au can be applied onto the slanted face in order to take an electrode from the lower side. Since the distance between the monitor PD and the LD is short, the rear light of the LD can be caused to enter the PD before the light diverges. Further, as the distance between the PD and the LD is short, there can an open space behind the PD. This part can be effectively used.

For example, if the IC 42 for driving the semiconductor LD 38 is disposed behind the monitor PD, the drive-output terminal of the IC and the electrode of the semiconductor LD can be connected directly to each other through a piece of Au wire in the shortest range only approximately 1 mm. This can serve as a drive circuit that is extremely low in floating capacity in parasitic inductance, and can have a structure suitable for a high-frequency transmitter of 5 Gbps through 10 Gbps.

All these elements had been fixed, the chips were then connected to each other through the Au line, and its whole subjected to potting with the silicone-based transparent resin 44 in order to protect the optical path and the chip from the outside. This transparent resin had the effect of suppressing divergence of the rear light of the semiconductor LD and increasing the monitor current, as well as the effect of protecting the chip.

The exterior of the element obtained in this way was made highly compact so as to be (4 mm in length×3 mm in width×2.5 mm in height).

If a conventional metal package is used, the diameter is enlarged to be 7 mm through 10 mm, and the length reaching approximately 15 mm through 20 mm, and, as a result, a bulky device is manufactured.

In contrast, in the structure of the present invention, the length is 4 mm, and even a driver IC can be mounted. As a result, an excellent size reduction could be achieved.

From the viewpoint of performance, the monitor current advantageously averaged 300 μA in the structure of FIG. 5, and an excellent waveform was observed during high-speed driving of 5 Gbps.

[Embodiment 2; α=45° (Rear-incident PD)(FIG. 8)]

Figure 8:
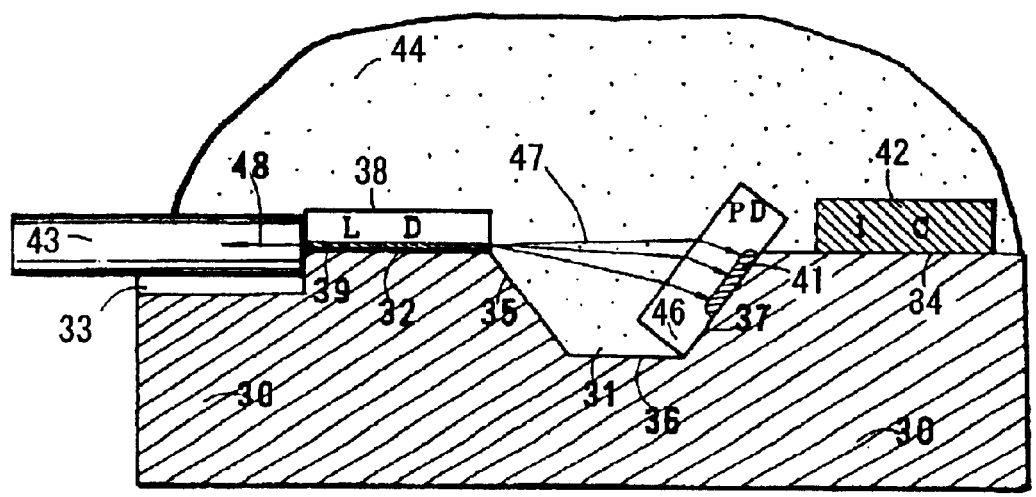
FIG. 8 is a longitudinal sectional view of an optical transmitter according to a second embodiment of the present invention that uses a rear-incident PD.

A rear-incident PD was used as the monitor PD as shown in FIG. 8. Except for this, a module was manufactured in almost the same way as in Embodiment 1.
[Substrate] Ceramic, Alumina ($Al_2O_3$)
4 mm in length×3 mm in width×1.2 mm in thickness
[Semiconductor LD] 1.3 μm InGaAsP-LD
0.3 mm×0.3 mm×0.12 mm$^t$

[Monitor PD] Rear-incident InGaAs-PD
Detecting area 0.2 mm in diameter
0.4 mm×0.4 mm×0.12 mm$^t$
[Exterior of module] 4 mm in length×3 mm in width×2.5 mm in height The rear light 47 of the LD 38 striking the rear face of the PD 46, was thereafter refracted, and guided to the detecting area. Since the refractive index of the PD had been high, the amount of light that reached the detecting area was large. A lens did not need to be provided on the rear face of the PD. From the viewpoint of performance, the monitor current advantageously averaged 300 μA, and the relationship between the PD and LD was stable, and an excellent waveform was observed during high-speed driving of 5 Gbps as in the Embodiment 1.

What is claimed is:

1. An optical transmitter comprising:

a substrate having a concave groove which consists of a single material and having a V-groove fixing an optical fiber;

a semiconductor laser diode for generating a transmission light beam forward and a monitor light beam backward, said laser diode being disposed on the substrate; and a monitor photodiode for sensing the monitor light beam of said laser diode, said monitor photodiode being disposed on a slanted side face of the concave groove;

wherein an active area of said monitor photodiode has an antireflection coating, and is disposed slantingly so that an oblique angle of the active area thereof is 30 through 50 degrees to a plane including the optical axis of the radiation light from said laser diode, and is parallel to a surface of the substrate so that the monitor light beam from said laser diode directly enters the active area of said monitor photodiode.

2. The optical transmitter according to claim 1, wherein the optical axis of the radiation light of said laser diode is caused to substantially coincide with a center of the active area of said monitor photodiode.

3. The optical transmitter according to claim 1 or 2, wherein the concave groove is mechanically formed by dicing.

4. The optical transmitter according to claim 1 or 2, wherein the substrate is a silicon (Si) single-crystal substrate, and the concave groove is formed on the Si substrate by etching.

5. The optical transmitter according to claim 1 or 2, wherein said laser diode, the concave groove, and a space including the active area of the m itor photodiode are covered with transparent resin.

6. The optical transmitter according to claim 1 or 2, wherein said laser diode comprises a InGaAsP based crystal, and said monitor photodiode comprises a InGaAs-based or InGaAsP-based crystal.

7. The optical transmitter according to claim 1 or 2, wherein a driving element of said laser diode is disposed behind said monitor photodiode, namely, on the other side of said laser diode taking said monitor photo diode as a center.

* * * * *

UNITED STATES PATENT AND TRADEMARK OFFICE
CERTIFICATE OF CORRECTION

PATENT NO. : 6,847,053 B2
DATED : January 25, 2005
INVENTOR(S) : Yoshiki Kuhara et al.

It is certified that error appears in the above-identified patent and that said Letters Patent is hereby corrected as shown below:

Column 16,
Line 50, please change "m itor" to -- monitor --.
Line 59, please delete "photo diode" and insert -- photodiode --.

Signed and Sealed this

Eleventh Day of October, 2005

JON W. DUDAS
*Director of the United States Patent and Trademark Office*